(12) United States Patent
Li et al.

(10) Patent No.: US 11,854,938 B2
(45) Date of Patent: Dec. 26, 2023

(54) ELECTROSTATIC PROTECTION DEVICE AND ELECTROSTATIC PROTECTION CIRCUIT

(71) Applicant: CHANGXIN MEMORY TECHNOLOGIES, INC., Hefei (CN)

(72) Inventors: Xin Li, Hefei (CN); Zhan Ying, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 129 days.

(21) Appl. No.: 17/453,210

(22) Filed: Nov. 2, 2021

(65) Prior Publication Data
US 2022/0068763 A1 Mar. 3, 2022

Related U.S. Application Data

(63) Continuation of application No. PCT/CN2021/103818, filed on Jun. 30, 2021.

(30) Foreign Application Priority Data

Aug. 26, 2020 (CN) .......................... 202010872697.7

(51) Int. Cl.
*H01L 23/48* (2006.01)
*H01L 27/02* (2006.01)
(Continued)

(52) U.S. Cl.
CPC .......... *H01L 23/48* (2013.01); *H01L 27/0266* (2013.01); *H01L 27/0292* (2013.01);
(Continued)

(58) Field of Classification Search
CPC . H01L 23/48; H01L 27/0266; H01L 27/0292; H01L 29/41766; H01L 29/42376;
(Continued)

(56) References Cited

U.S. PATENT DOCUMENTS 7,986,011 B2    7/2011  Blanc et al.
9,117,677 B2 *  8/2015  Ma ...................... H01L 23/5228
(Continued)

FOREIGN PATENT DOCUMENTS

CN    101283452 A      10/2008
CN    101398532 A  *   4/2009  ............. G09G 3/348
(Continued)

OTHER PUBLICATIONS

Nath, Anindya; Ultra-low Loss electrostatic discharge device with controllable trigger voltage; Figures, specification (Year: 2006).*
(Continued)

*Primary Examiner* — Dharti H Patel
(74) *Attorney, Agent, or Firm* — Cooper Legal Group, LLC (57) ABSTRACT

The present disclosure provides an electrostatic protection device and an electrostatic protection circuit. The electrostatic protection device includes: a discharge transistor, located on a substrate for discharging electrostatic charges; and a first pad, located on a first metal layer and electrically connected to a drain region of the discharge transistor; wherein a projection of the first pad on the substrate partially overlaps a projection of the drain region on the substrate.

19 Claims, 6 Drawing Sheets

(51) Int. Cl.
  *H02H 1/00* (2006.01)
  *H02H 9/04* (2006.01)
  *H01L 29/423* (2006.01)
  *H01L 29/417* (2006.01)
  *H01L 23/00* (2006.01)

(52) U.S. Cl.
  CPC .. *H01L 29/41766* (2013.01); *H01L 29/42376* (2013.01); *H02H 1/0007* (2013.01); *H02H 9/046* (2013.01); *H01L 24/04* (2013.01); *H01L 24/05* (2013.01); *H01L 2224/04042* (2013.01); *H01L 2224/05569* (2013.01)

(58) Field of Classification Search
  CPC .............. H01L 24/04; H01L 24/05; H01L 2224/04042; H01L 2224/05569; H01L 27/0285; H01L 27/0296; H01L 29/0692; H01L 29/78; H01L 29/41758; H01L 29/4238; H02H 1/0007; H02H 9/046
  USPC .......................................................... 361/56
  See application file for complete search history.

(56) References Cited

U.S. PATENT DOCUMENTS

| | | | |
|---|---|---|---|
| 9,728,529 B2 | 8/2017 | Weyers et al. | |
| 10,777,546 B2 | 9/2020 | Peng et al. | |
| 10,867,987 B2 | 12/2020 | Peng et al. | |
| 2008/0099857 A1* | 5/2008 | Furuta | H01L 29/78 257/E29.345 |
| 2016/0204598 A1* | 7/2016 | Wang | H01L 27/0255 361/56 |

FOREIGN PATENT DOCUMENTS

| | | | | |
|---|---|---|---|---|
| CN | 102361033 A | * | 2/2012 | |
| CN | 104979342 A | | 10/2015 | |
| CN | 107065318 A | * | 8/2017 | ......... G02F 1/13394 |
| CN | 108122902 A | | 6/2018 | |
| CN | 109585438 A | | 4/2019 | |
| CN | 113097206 A | * | 7/2021 | ......... H01L 27/0248 |
| DE | 102021123640 A1 | * | 4/2022 | ......... H01L 27/0248 |
| JP | 2003258114 A | | 9/2003 | |
| JP | 2005303279 A | * | 10/2005 | ......... G01R 31/2884 |
| TW | 202043888 A | * | 12/2020 | |
| TW | 202145173 A | * | 12/2021 | |
| WO | WO-2005088702 A1 | * | 9/2005 | ......... G01R 31/2884 |

OTHER PUBLICATIONS

International Search Report cited in PCT/CN2021/103818 dated Aug. 26, 2020, 9 pages.

* cited by examiner

ELECTROSTATIC PROTECTION DEVICE AND ELECTROSTATIC PROTECTION CIRCUIT

CROSS-REFERENCE TO RELATED APPLICATIONS

This is a continuation of International Application No. PCT/CN2021/103818, filed on Jun. 30, 2021, which claims the priority to Chinese Patent Application 202010872697.7, titled "ELECTROSTATIC PROTECTION DEVICE AND ELECTROSTATIC PROTECTION CIRCUIT" and filed to the CNIPA on Aug. 26, 2020. The entire contents of International Application No. PCT/CN2021/103818 and Chinese Patent Application 202010872697.7 are incorporated herein by reference.

TECHNICAL FIELD

The present disclosure relates to, but is not limited to, an electrostatic protection device and an electrostatic protection circuit.

BACKGROUND

Static electricity is everywhere. If there is no electrostatic protection circuit, a chip will soon be damaged by a variety of static electricity, and this damage is usually fatal.

In order to improve the electrostatic discharge capability of an electrostatic protection circuit, a discharge transistor usually needs to have a relatively large size. In addition, the pulse characteristic of the electrostatic protection circuit determine that a resistor and a capacitor will occupy a relatively large chip area, which is plus a relatively large area of a discharge transistor to cause a relatively large effective area of the electrostatic protection circuit applied to chip pins.

SUMMARY

The following is a summary of subject matters detailed in the present disclosure. The summary is not intended to limit the protection scope of the claims.

Embodiments of the present disclosure provide an electrostatic protection device, including: a discharge transistor, located on a substrate and configured to discharge electrostatic charges; and a first pad, located on a first metal layer and electrically connected to a drain region of the discharge transistor; wherein a projection of the first pad on the substrate partially overlaps a projection of the drain region on the substrate.

Embodiments of the present disclosure further provide an electrostatic protection circuit, including: the electrostatic protection device described above; a power terminal, electrically connected to the first pad; and a ground terminal, electrically connected to a source region of the discharge transistor.

Embodiments of the present disclosure further provide an electrostatic protection circuit, including: the electrostatic protection device described above; and an input/output terminal, electrically connected to the first pad; wherein the discharge transistor is a P-type transistor, and the electrostatic protection circuit further includes a power terminal electrically connected to a source region of the discharge transistor; or the discharge transistor is an N-type transistor, and the electrostatic protection circuit further including a ground terminal electrically connected to the source region of the discharge transistor.

Other aspects will be apparent upon reading and understanding the accompanying drawings and detailed description.

BRIEF DESCRIPTION OF THE DRAWINGS

One or more embodiments are exemplified by corresponding drawings. These exemplified descriptions do not constitute limitations on the embodiments. The elements with the same reference numerals in the drawings are denoted as similar elements. Unless otherwise stated, the drawings do not constitute proportional limitations. For those skilled in the art, other drawings can be obtained based on these drawings without any creative efforts.

DETAILED DESCRIPTION

In order to make the objectives, technical solutions and advantages of the embodiments of the present disclosure clearer, the embodiments of the present disclosure will be described in detail below with reference to the accompanying drawings. However, those skilled in the art can understand that, in each embodiment of the present disclosure, many technical details are proposed in order to enable a reader to better understand the present application. However, the technical solutions claimed in the present application can also be implemented without these technical details and various variations and modifications based on the following embodiments.

As chip pins gradually increase, the decrease in the effective area of an electrostatic protection circuit has become an optimization direction that is worth trying. The electrostatic protection device and the electrostatic protection circuit provided by the present disclosure reduce the effective chip area of the electrostatic protection device, and improve the electrostatic discharge speed and discharge capability of the electrostatic protection device.

Figure 1:
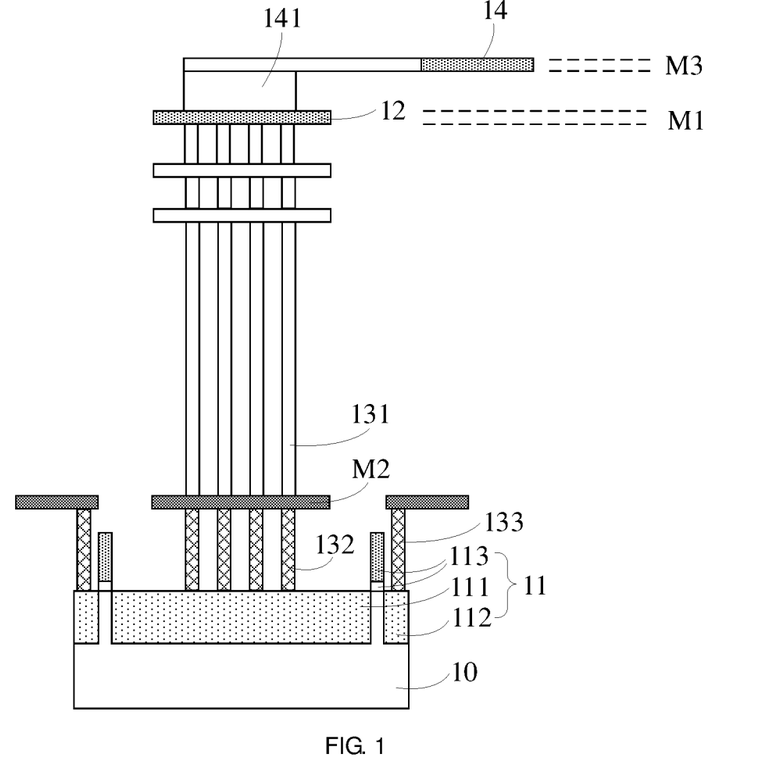
FIG. 1 is a front view of an electrostatic protection device according to an embodiment of the present disclosure.
Figure 2:
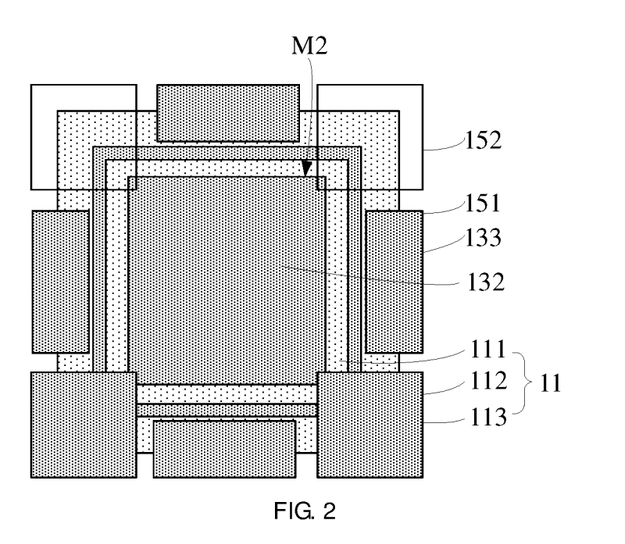
FIG. 2 is a top view of the electrostatic protection device according to an embodiment of the present disclosure.
Figure 3:
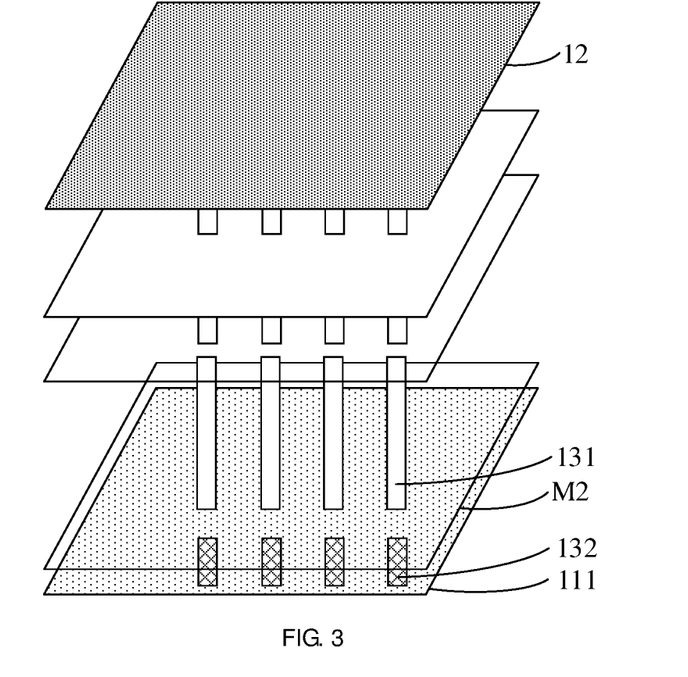
FIG. 3 is a partial three-dimensional structure diagram of the electrostatic protection device according to an embodiment of the present disclosure.

Referring to FIGS. 1 to 3, FIGS. 1 to 3 are schematic structure diagrams of an electrostatic protection device provided by an embodiment of the present disclosure. FIG. 1 is a front view of the electrostatic protection device, FIG. 2 is a top view of the electrostatic protection device, and FIG. 3 is a partial three-dimensional structure diagram of the electrostatic protection device.

The electrostatic protection device includes: a discharge transistor 11, located on a substrate 10 for discharging electrostatic charges; and a first pad 12, located on a first metal layer M1 and electrically connected to a drain region 111 of the discharge transistor 11; wherein the projection of the first pad 12 on the substrate 10 partially overlaps the projection of the drain region 111 on the substrate 10.

In some embodiments of the present disclosure, the projection of the first pad 12 on the substrate 10 is a first projection, the projection of the drain region 111 on the substrate 10 is a second projection, and the first projection is located within the second projection. As such, the effective area of the electrostatic protection device can be further reduced, so that more space is reserved for other electronic components in a direction parallel to the surface of the substrate 10. Meanwhile, the distance between the first pad 12 and the drain region 111 is the shortest, which is beneficial to improving the electrostatic discharge capability of the electrostatic protection device.

In some embodiments of the present disclosure, the electrostatic protection device further includes: a second metal layer M2, located between the first metal layer M1 and the drain region 111, the second metal layer M2 being electrically connected to the first metal layer M1 by conductive plugs 131, and the drain region 111 being electrically connected to the second metal layer M2 by first contact holes 132.

One or more metal layers may be further disposed between the first metal layer M1 and the second metal layer M2, and the adjacent metal layers may be electrically connected by the conductive plugs 131; the conductive plugs 131 and the first contact holes 132 are made of different materials, the material of the conductive plugs 131 is usually a metal, such as copper, aluminum, cobalt, nickel, or an alloy composed of multiple metals, etc., and the material of the first contact holes 132 is usually a metal semiconductor material, such as cobalt silicide or nickel silicide.

In some embodiments of the present disclosure, the projection of the conductive plugs 131 on the substrate 10 is a third projection, the projection of the first contact holes 132 on the substrate 10 is a fourth projection, and both the third projection and the fourth projection are located within the second projection. Hence, the effective area of the electrostatic protection device can be reduced.

The fourth projection is also located within the first projection. As such, the first pad 12 may be connected with the drain region 111 by means of vertical connection, without increasing the length of a conductive path of discharge current in the second metal layer M2 and the conductive plugs 131, thereby reducing the parasitic resistance of a flow path of the discharge current and improving the discharge capability of the electrostatic protection device.

Figure 4:
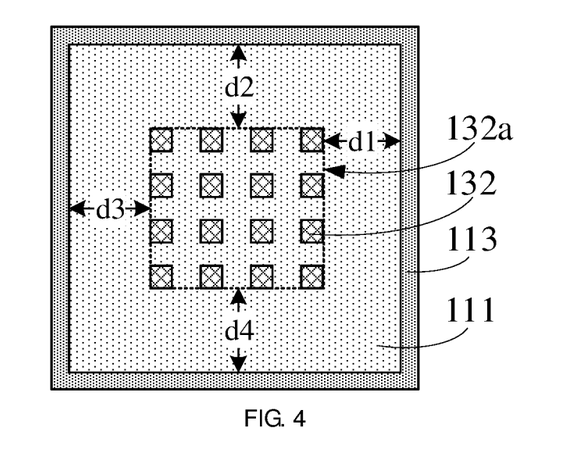
FIG. 4 is a partial cross-sectional structure diagram of an electrostatic protection device according to an embodiment of the present disclosure.

In some embodiments of the present disclosure, referring to FIG. 4, a plurality of first contact holes 132 constitute a first contact hole array 132a, and the first contact hole array 132a is centrally symmetric with respect to the center of the drain region 111. This ensures that the discharge current flowing to a source region 112 (refer to FIG. 1) through the first contact holes 132 has a better uniformity, and further ensures that the discharge transistor 11 has a good discharge capability.

In other embodiments, a plurality of first contact holes with a smaller size may be combined to form a first contact hole with a larger cross-sectional size, thereby further reducing the parasitic resistance of the first contact holes and further improving the discharge capability of the electrostatic protection device.

Continuing to refer to FIGS. 1, 2 and 3, in one embodiment, the conductive plugs 131 and the first contact holes 132 are completely located under the first pad 12, and ESD discharge current flows from the first pad 12 to the second metal layer M2 through the conductive plugs 131 and then to the drain region 111 of the discharge transistor 11 through the first contact holes 132. As such, the path of the ESD discharge current is the shortest, thereby further improving the discharge capability of the electrostatic protection device. The first contact holes 132 can even get rid of the restriction of the DRC rule. For example, the 4×4 first contact holes 132 in FIG. 2 are made into a large contact hole, so that the parasitic resistance on the current discharge path is smaller, which further improves the discharge capability of the electrostatic protection device.

In some embodiments of the present disclosure, the first contact holes 132 are recessed contact holes, that is, the first contact holes 132 are partially located in the drain region 111. This further reduces the contact resistance between the first contact holes 132 and the drain region 111, thereby improving the electrostatic discharge capability of the electrostatic protection device.

In some embodiments of the present disclosure, referring to FIG. 4, a gate structure 113 of the discharge transistor 11 (refer to FIG. 1) is in a form of ring shape, and the distances between the outer edge of the first contact hole array 132a and corresponding inner edge of the gate structure 113 are equal. In different directions of the first contact hole array 132a toward the gate structure 113, there are a first distance d1, a second distance d2, a third distance d3 and a fourth distance d4 between the outer edge of the first contact hole array 132a and the corresponding inner edge of the gate structure 113, and the first distance d1, the second distance d2, the third distance d3 and the fourth distance d4 are equal.

This is beneficial to uniform flow of the discharge current in multiple directions of the first contact hole array 132a toward the gate structure 113, and ensures that the discharge transistor 11 has a good current discharge capability.

Continuing to refer to FIGS. 1 and 2, in some embodiments of the present disclosure, a source region 112 of the discharge transistor 11 is connected to second contact holes 133, and the distance between the second contact holes 133 and the gate structure 113 of the discharge transistor 11 is less than the distance between the first contact holes 132 and the gate structure 113 of the discharge transistor 11. The drain region 111 has a larger exposed area on the flow path of the discharge current, so that the drain region 111 has a better heat dissipation capability, the drain region 111 is prevented from overheating damage due to larger current, and the discharge transistor 11 has good discharge capability and stronger reliability.

In some embodiments of the present disclosure, the LDD structure may not be disposed between the drain region 111 and the source region 112 to further reduce the on-resistance, improve the discharge capability and reduce heat generation; in addition, a well region may also be added below the drain region 111, or the drain region 111 and the source region 112 are integrally placed in a well region, thereby reducing electric leakage problem of the discharge transistor 11.

In some embodiments of the present disclosure, the gate structure 113 of the discharge transistor 11 is in a form of ring shape, and the drain region 111 is located in the gate structure 113. As such, the uniformity of the discharge current can be further improved.

In some embodiments of the present disclosure, the ring shape includes a regular polygon such as a quadrilateral, a hexagon, and an octagon, and the number of sides of the regular polygon is an even number.

Figure 5:
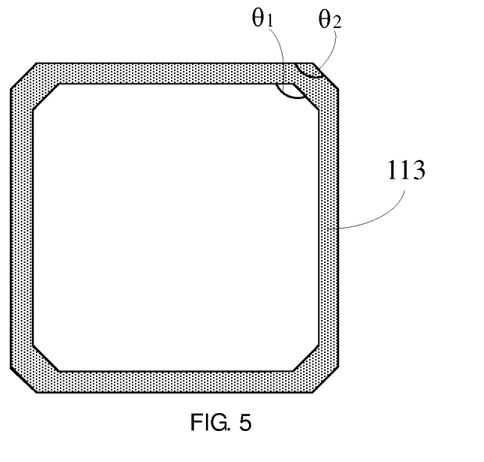
FIG. 5 is a cross-sectional structure diagram of a gate structure according to an embodiment of the present disclosure.

In some embodiments of the present disclosure, inner corners of the ring shape are all greater than 90 degrees. Referring to FIG. 5, taking the ring shape of the gate structure 113 as a regular quadrilateral as an example, the inner contour of the ring shape has first corners $\theta 1$, and the outer contour has second corners $\theta 2$. Chamfers are formed at the corners of the inner contour and the outer contour, so that the first corners $\theta 1$ and the second corners $\theta 2$ of the ring shape are greater than 90 degrees. This reduces the current impact intensity at the corners of the gate structure 113, avoids premature aging and damage of the corners due to excessive current impact, and ensures that the discharge transistor 11 has a longer service life.

Small sides formed by the chamfers are not counted into the number of sides of the ring shape. In addition, in other embodiments, only the first corners of the inner contour or the second corners of the outer contour may be adjusted, that is, chamfers are only formed at the corners of the inner or outer contour.

Figure 6:
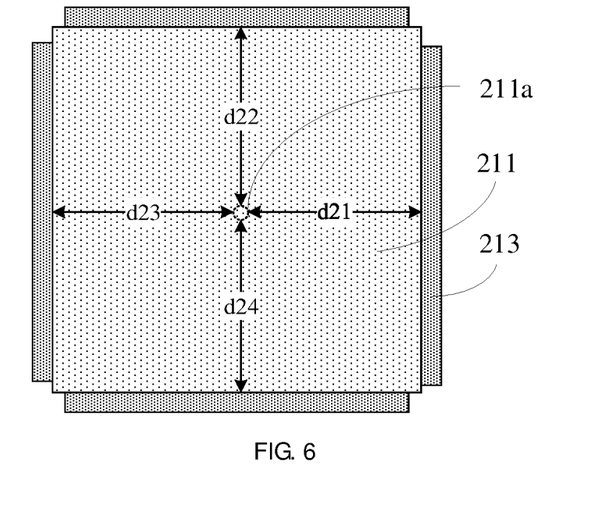
FIG. 6 is a schematic structure diagram of an electrostatic protection device according to an embodiment of the present disclosure.

In some embodiments of the present disclosure, referring to FIG. 6, when the gate structure 213 is not in a form of ring shape, the gate structure 213 is centrally symmetric with respect to a center point 211*a* of the drain region 211. In different directions of the center point 211*a* toward the gate structure 213, there are a first center distance d21, a second center distance d22, a third center distance d23 and a fourth center distance d24 between the center point 211*a* and the gate structure 213, and the first center distance d21, the second center distance d22, the third center distance d23 and the fourth center distance d24 are equal. This ensures the uniformity of the discharge current of the discharge transistor.

In some embodiments of the present disclosure, the area of the drain region 111 is larger than the area of the source region 112 of the discharge transistor 11. This ensures that the drain region 111 has a better heat dissipation capability.

Continuing to refer to FIG. 2, in some embodiments of the present disclosure, the electrostatic protection device further includes third metal layers 151 and fourth metal layers 152. The third metal layers 151, the fourth metal layers 152 and the second metal layer M2 are arranged on the same layer, and the third metal layers 151 are connected to the second contact holes 133. In an embodiment, for example, the third metal layers 151 are further connected with a ground terminal for discharging electrostatic current of a power terminal to the ground terminal. The fourth metal layers 152 are electrically connected with the second metal layer M2 to draw out the voltage of the drain region 111. In one embodiment, for example, the second metal layer M2 is connected to the power terminal, and the fourth metal layers 152 are configured to electrically connect the power terminal to other circuits.

Figure 7:
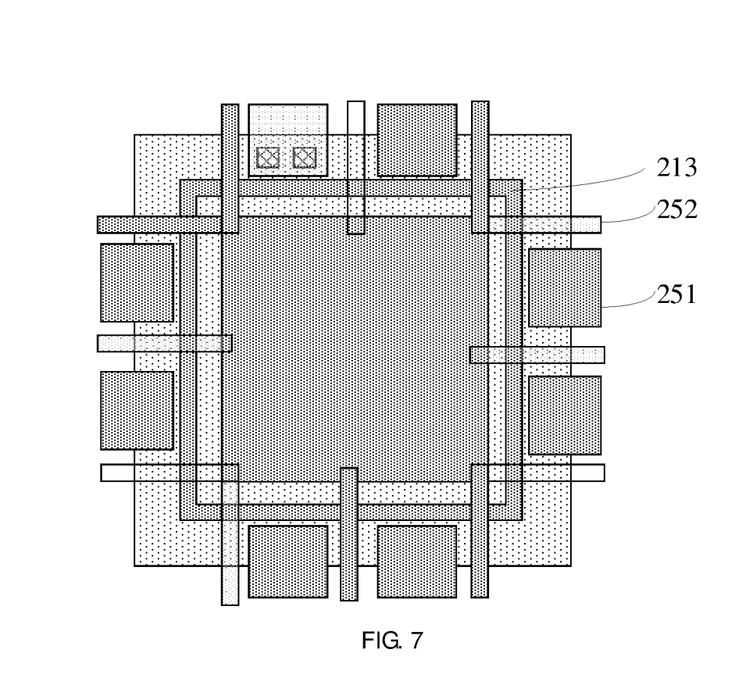
FIG. 7 is a schematic structure diagram of an electrostatic protection device according to an embodiment of the present disclosure.

In some embodiments of the present disclosure, the fourth metal layers 152 are connected with corners of the second metal layer M2, so that a larger space is reserved for the third metal layers 151. In other embodiments, referring to FIG. 7, the third metal layers 251 and the fourth metal layers 252 are arranged at intervals on one side of the gate structure 213.

Continuing to refer to FIG. 2, in some embodiments of the present disclosure, the second metal layer M2, the third metal layers 151, and the fourth metal layers 152 may all be chamfered, similar to the chamfer structure in FIG. 5. The chamfering can also reduce the impact of current on the metal layers, thereby improving the service life of the metal layers and the reliability of the metal layers.

In some embodiments of the present disclosure, the electrostatic protection device further includes a wire bonding pad 14 located on the re-distribution metal layer M3, the wire bonding pad 14 is electrically connected to the first pad 12, and the re-distribution metal layer M3 is located above the first metal layer M1, that is, on the side of the first metal layer M1 away from the substrate 10.

Since the first pad 12 is no longer required for wire bonding, the space originally reserved for wire bonding by the first pad 12 can be omitted, thereby reducing the size of the first pad 12, for example, the size of the reduced first pad 12 in a direction parallel to the surface of the substrate 10 may be less than or equal to 30 μm×30 μm, or even smaller.

In some embodiments of the present disclosure, the electrostatic protection device further includes a re-distribution via 141 for electrically connecting the first metal layer M1 and the re-distribution metal layer M3.

Continuing to refer to FIGS. 1, 2 and 3, in some embodiments of the present disclosure, the projection of the first pad 12 on the substrate 10 is a first projection, the projection of the drain region 111 on the substrate 10 is a second projection, the projection of the re-distribution via 141 on the substrate 10 is a fifth projection, the projection of the wire bonding pad 14 on the substrate 10 is a sixth projection, both the first projection and the fifth projection are located within the second projection, and the sixth projection is located outside the second projection. The position of the wire bonding pad is redefined through On Die Re-distribution Layer technology, which prevents the stress of wire bonding of the wire bonding pad 14 from affecting the drain region 111 of the discharge transistor 11, thereby ensuring that the discharge transistor 11 has a good discharge capability.

In some embodiments of the present disclosure, the wire bonding pad 14 has an area larger than the area of the first pad 12, for example, the area of the wire bonding pad 14 is equal to 60 μm×60 μm. This reduces the difficulty in wire bonding of the electrostatic protection device.

In some embodiments of the present disclosure, the projection of the wire bonding pad 14 partially overlaps the projection of the drain region 111, which is beneficial to reducing the effective chip area of the electrostatic protection device, and further reserves a space for other electronic components in a direction parallel to the surface of the substrate 10; in addition, the partial overlap of the projections is also beneficial to shortening the length of a wire between the wire bonding pad 14 and the drain region 111, thereby reducing the parasitic resistance and parasitic capacitance on the electrostatic discharge path, and improving the discharge speed and discharge capability of the electrostatic protection device.

Correspondingly, the embodiments of the present disclosure further provide an electrostatic protection circuit, and the electrostatic protection circuit includes any of the electrostatic protection devices described above.

Figure 8:
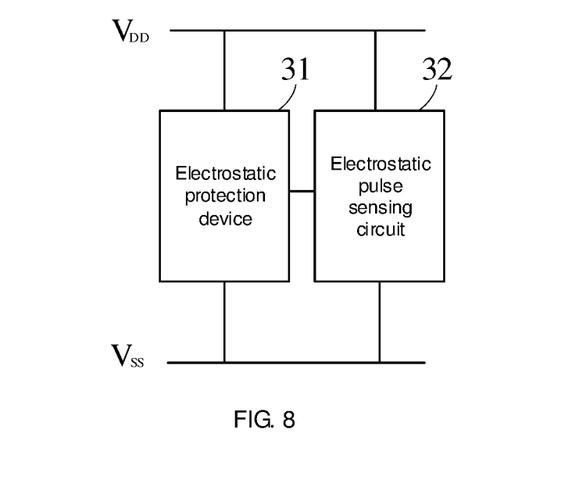
FIG. 8 is a schematic structure diagram of an electrostatic protection circuit according to an embodiment of the present disclosure.

Referring to FIGS. 1 and 8, the electrostatic protection circuit includes: the electrostatic protection device 31 according to any one of the above; a power terminal VDD electrically connected to the wire bonding pad 14; and a ground terminal VSS electrically connected to the source region 112 of the discharge transistor 11.

In some embodiments of the present disclosure, the electrostatic protection circuit further includes: an electrostatic pulse sensing circuit 32, connected between the power terminal VDD and the ground terminal VSS, for sensing electrostatic pulses of the power terminal VDD and outputting a pulse identification signal, the discharge transistor 11 being turned on or off based on the pulse identification signal.

Figure 9:
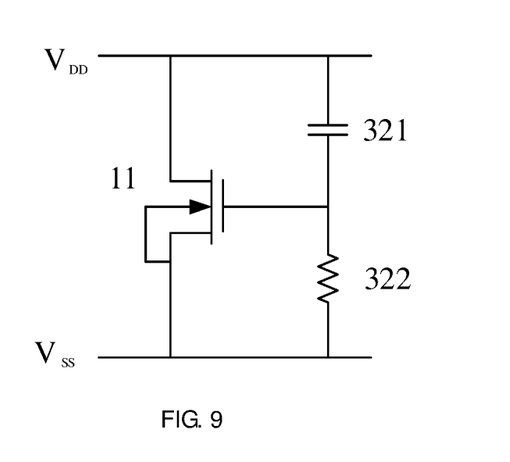
FIG. 9 is a schematic structure diagram of an electrostatic protection circuit according to an embodiment of the present disclosure.

Referring to FIG. 9, the electrostatic pulse sensing circuit 32 includes a capacitor 321 and a resistor 322, a first terminal of the capacitor 321 is connected to the power terminal VDD, a second terminal of the capacitor 321 is connected to a first terminal of the resistor 322, a second terminal of the resistor 322 is connected to the ground terminal VSS, and the second terminal of the capacitor 321 is connected to the gate structure 113 of the discharge transistor 11.

FIG. 9 is a simple drawing of the electrostatic protection circuit, the discharge transistor 11 is configured to illustrate the electrostatic protection device 31, and the same simple drawing in other subsequent drawings will not be described again.

Figure 10:
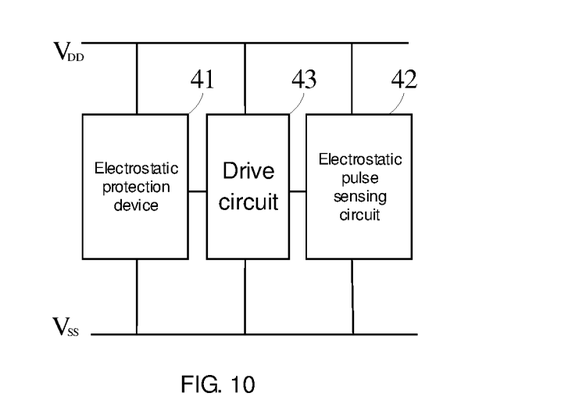
FIG. 10 is a schematic structure diagram of an electrostatic protection circuit according to an embodiment of the present disclosure.

In other embodiments, referring to FIG. 10, the electrostatic protection circuit further includes a drive circuit 43 connected between the power terminal VDD and the ground terminal VSS, the drive circuit 43 receives the pulse identification signal outputted by the electrostatic pulse sensing circuit 42 and outputs a drive signal to the electrostatic protection device 31, and the drive signal is connected to the gate structure of the discharge transistor.

Figure 11:
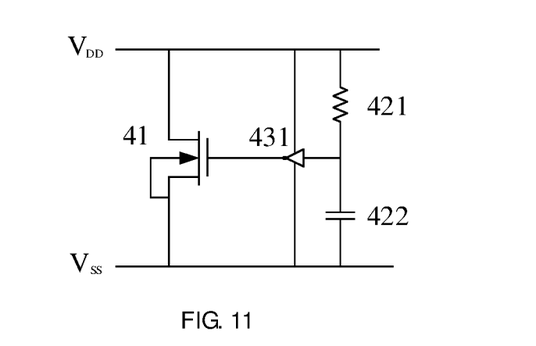
FIG. 11 is a schematic structure diagram of an electrostatic protection circuit according to an embodiment of the present disclosure.

Referring to FIG. 11, the electrostatic pulse sensing circuit 42 (refer to FIG. 10) includes a resistor 421 and a capacitor 422, a first terminal of the resistor 421 is connected to the power terminal VDD, a second terminal of the resistor 421 is connected to a first terminal of the capacitor 422, and a second terminal of the capacitor 422 is connected to the ground terminal VSS; the drive circuit 43 (refer to FIG. 10) includes an inverter 431, an input terminal of the inverter 431 is connected to the second terminal of the resistor 421, and an output terminal of the inverter 431 is connected to the gate structure of the discharge transistor 41.

In some embodiments of the present disclosure, an electrostatic protection circuit that can be applied between a power terminal and a ground terminal is provided, which is beneficial to improving the electrostatic discharge capability between the power terminal and the ground terminal.

Correspondingly, the embodiments of the present disclosure further provide an electrostatic protection circuit, and the electrostatic protection circuit includes any of the electrostatic protection devices described above.

Figure 13:
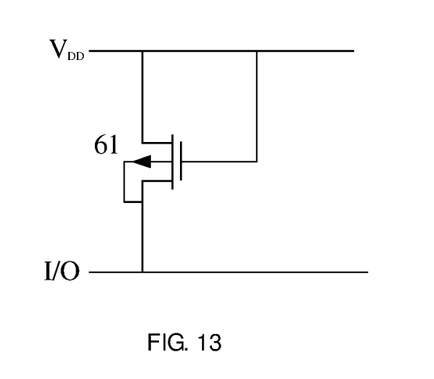
FIG. 13 is a schematic structure diagram of an electrostatic protection circuit according to an embodiment of the present disclosure.

Referring to FIG. 13, the electrostatic protection circuit includes: the electrostatic protection device according to any one of the above; an input/output terminal I/O, electrically connected to the first pad; and a power terminal VDD connected to the source region of the discharge transistor 61.

The source region of the discharge transistor 61 is electrically connected with the gate structure of the discharge transistor 61, and the discharge transistor 61 is a P-type transistor.

In this embodiment, an electrostatic protection circuit that can be applied between the input/output terminal and the power terminal is provided, which is beneficial to improving the electrostatic discharge capability between the input/output terminal and the power terminal.

Figure 12:
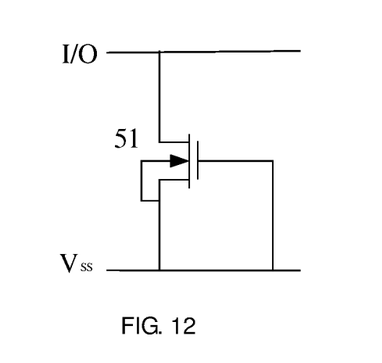
FIG. 12 is a schematic structure diagram of an electrostatic protection circuit according to an embodiment of the present disclosure.

Referring to FIG. 12, the electrostatic protection circuit includes: the electrostatic protection device according to any one of the above; an input/output terminal I/O electrically connected with the first pad; and a ground terminal VSS connected to the source region of the discharge transistor 51.

The source region of the discharge transistor 51 is electrically connected to the gate structure of the discharge transistor 51, and the discharge transistor 51 is an N-type transistor.

In this embodiment, an electrostatic protection circuit that can be applied between the input/output terminal and the ground terminal is provided, which is beneficial to improving the electrostatic discharge capability between the input/output terminal and the ground terminal.

A person skilled in the art would easily conceive of other embodiments of the present disclosure after considering the specification and the disclosure of practice. The present disclosure is intended to cover any variations, uses or adaptive changes of the present disclosure. These variations, uses or adaptive changes follow the general principle of the present disclosure and comprise common general knowledge or conventional technical means in the technical field that are not disclosed in the present disclosure. The specification and the embodiments are merely regarded as exemplary, and the real scope and spirit of the present disclosure are pointed out by the following claims.

It should be understood that the present disclosure is not limited to the precise structure described above and shown in the drawings, and various modifications and changes can be made without departing from its scope. The scope of the present disclosure is only limited by the appended claims.

INDUSTRIAL APPLICABILITY

In the electrostatic protection device and electrostatic protection circuit provided by the present disclosure, the projection of the first pad partially overlaps the projection of the drain region, which is beneficial to reducing the effective chip area of the electrostatic protection device, and reserves a space for other electronic components in a direction parallel to the surface of the substrate; in addition, the partial overlap of the projections is also beneficial to shortening the length of a wire between the first pad and the drain region, thereby reducing the parasitic resistance and parasitic capacitance on the electrostatic discharge path, and improving the discharge speed and discharge capability of the electrostatic protection device.

The invention claimed is:
1. An electrostatic protection device, comprising:
a discharge transistor, located on a substrate and configured to discharge electrostatic charges;
a first pad, located on a first metal layer and electrically connected to a drain region of the discharge transistor; and
a second metal layer, located between the first metal layer and the drain region, the second metal layer being electrically connected to the first metal layer by con- ductive plugs, and the drain region being electrically connected to the second metal layer by first contact holes;

wherein a projection of the first pad on the substrate partially overlaps a projection of the drain region on the substrate;

wherein the projection of the first pad on the substrate is a first projection, the projection of the drain region on the substrate is a second projection, and the first projection is located within the second projection.

2. The electrostatic protection device according to claim 1, wherein a projection of the conductive plugs on the substrate is a third projection, a projection of the first contact holes on the substrate is a fourth projection, and both the third projection and the fourth projection are located within the second projection.

3. The electrostatic protection device according to claim 2, wherein a plurality of the first contact holes constitute a first contact hole array, and the first contact hole array is centrally symmetric with respect to a center of the drain region.

4. The electrostatic protection device according to claim 3, wherein the first contact holes are recessed contact holes.

5. The electrostatic protection device according to claim 3, wherein a gate structure of the discharge transistor is in a form of ring shape, and distances between an outer edge of the first contact hole array and corresponding inner edge of the gate structure are equal.

6. The electrostatic protection device according to claim 3, wherein a source region of the discharge transistor is connected to second contact holes, and a distance between the second contact holes and a gate structure of the discharge transistor is less than a distance between the first contact holes and the gate structure of the discharge transistor.

7. The electrostatic protection device according to claim 1, wherein a gate structure of the discharge transistor is in a form of ring shape, and the drain region is located in the gate structure;

wherein the ring shape comprises a quadrilateral, a hexagon, or an octagon;

inner corners of the ring shape are all greater than 90 degrees.

8. The electrostatic protection device according to claim 1, wherein a gate structure of the discharge transistor is centrally symmetric with respect to a center point of the drain region.

9. The electrostatic protection device according to claim 1, wherein an area of the drain region is larger than an area of a source region of the discharge transistor.

10. The electrostatic protection device according to claim 1, further comprising:

a wire bonding pad, located on a re-distribution metal layer, the wire bonding pad being electrically connected to the first pad, and the re-distribution metal layer being located above the first metal layer; and a re-distribution via, configured to electrically connect the first metal layer and the re-distribution metal layer.

11. The electrostatic protection device according to claim 10, wherein a projection of the re-distribution via on the substrate is a fifth projection, a projection of the wire bonding pad on the substrate is a sixth projection, the fifth projection is located within the second projection, and the sixth projection is located outside the second projection;

wherein the wire bonding pad has an area larger than an area of the first pad.

12. An electrostatic protection circuit, comprising:
the electrostatic protection device according to claim 1;
a power terminal, electrically connected to the first pad; and
a ground terminal, electrically connected to a source region of the discharge transistor.

13. The electrostatic protection circuit according to claim 12, further comprising:

an electrostatic pulse sensing circuit, connected between the power terminal and the ground terminal, and configured to sense electrostatic pulses of the power terminal and output a pulse identification signal, the discharge transistor being turned on or off based on the pulse identification signal.

14. The electrostatic protection circuit according to claim 13, further comprising:

a drive circuit, connected between the power terminal and the ground terminal, wherein the drive circuit receives the pulse identification signal and outputs a drive signal, and the drive signal is connected to a gate structure of the discharge transistor.

15. The electrostatic protection circuit according to claim 14, wherein the electrostatic pulse sensing circuit comprises a resistor and a capacitor, a first terminal of the resistor is connected to the power terminal, a second terminal of the resistor is connected to a first terminal of the capacitor, and a second terminal of the capacitor is connected to the ground terminal;

the drive circuit comprises an inverter, an input terminal of the inverter is connected to the second terminal of the resistor, and an output terminal of the inverter is connected to the gate structure of the discharge transistor.

16. The electrostatic protection circuit according to claim 13, wherein the electrostatic pulse sensing circuit comprises a resistor and a capacitor, a first terminal of the capacitor is connected to the power terminal, a second terminal of the capacitor is connected to a first terminal of the resistor, a second terminal of the resistor is connected to the ground terminal, and the second terminal of the capacitor is connected to a gate structure of the discharge transistor.

17. An electrostatic protection circuit, comprising:
the electrostatic protection device according to claim 1; and
an input/output terminal, electrically connected to the first pad;
wherein the discharge transistor is a P-type transistor, and the electrostatic protection circuit further comprises a power terminal electrically connected to a source region of the discharge transistor;
or the discharge transistor is an N-type transistor, and the electrostatic protection circuit further comprises a ground terminal electrically connected to the source region of the discharge transistor.

18. The electrostatic protection circuit according to claim 17, wherein the source region of the discharge transistor is electrically connected to a gate structure of the discharge transistor.

19. An electrostatic protection device, comprising:
a discharge transistor, located on a substrate and configured to discharge electrostatic charges;
a first pad, located on a first metal layer and electrically connected to a drain region of the discharge transistor;
a wire bonding pad, located on a re-distribution metal layer, the wire bonding pad being electrically connected to the first pad, and the re-distribution metal layer being located above the first metal layer; and
a re-distribution via, configured to electrically connect the first metal layer and the re-distribution metal layer;

wherein a projection of the first pad on the substrate partially overlaps a projection of the drain region on the substrate.

\* \* \* \* \*